United States Patent
Huang

(10) Patent No.: US 11,222,819 B2
(45) Date of Patent: Jan. 11, 2022

(54) REPAIRING METAL WIRE(S) AND EXTERNAL CONNECTION WIRE(S) OF A DISPLAY PANEL DAMAGED BY STATIC ELECTRICITY BY USING CONDUCTIVE GLASS WIRE(S)

(71) Applicant: HKC CORPORATION LIMITED, Shenzhen (CN)

(72) Inventor: Bei Zhou Huang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 506 days.

(21) Appl. No.: 16/313,029

(22) PCT Filed: Oct. 23, 2018

(86) PCT No.: PCT/CN2018/111395
§ 371 (c)(1),
(2) Date: Dec. 23, 2018

(87) PCT Pub. No.: WO2019/085788
PCT Pub. Date: May 9, 2019

(65) Prior Publication Data
US 2021/0225703 A1 Jul. 22, 2021

(30) Foreign Application Priority Data
Nov. 3, 2017 (CN) .......................... 201711071332.9

(51) Int. Cl.
*H01L 21/768* (2006.01)
*H01L 27/12* (2006.01)
*G02F 1/1362* (2006.01)

(52) U.S. Cl.
CPC .. *H01L 21/76894* (2013.01); *G02F 1/136204* (2013.01); *G02F 1/136259* (2013.01);
(Continued)

(58) Field of Classification Search
CPC ............... H01L 27/1259; H01L 27/124; H01L 21/76894; G02F 1/136204; G02F 1/136259; G02F 1/136286
See application file for complete search history.

(56) References Cited

U.S. PATENT DOCUMENTS 5,303,074 A * 4/1994 Salisbury .............. G02F 1/1309
349/55
2007/0035491 A1* 2/2007 Chen .................... G09G 3/3611
345/87
2012/0287366 A1 11/2012 Tanaka et al.

FOREIGN PATENT DOCUMENTS

CN 101158760 A 4/2008
CN 103034008 A 4/2013
(Continued)

OTHER PUBLICATIONS

Xijie Chen, the International Searching Authority written comments, dated Jan. 2019, CN.
(Continued)

*Primary Examiner* — Ermias T Woldegeorgis

(57) ABSTRACT

The present application relates to a display panel and a manufacturing method. The display panel includes: a substrate; the substrate includes a display area inside and a wiring area outside; the wiring area includes external connection wires; the external connection wires are coupled with metal wires; and conductive glass tracks are correspondingly arranged at side edges of the external connection wires and the metal wires.

19 Claims, 7 Drawing Sheets

(52) U.S. Cl.
CPC ...... *G02F 1/136286* (2013.01); *H01L 27/124* (2013.01); *H01L 27/1259* (2013.01)

(56) References Cited

FOREIGN PATENT DOCUMENTS

| CN | 103984133 A | 8/2014 |
| CN | 105590573 A | 5/2016 |
| CN | 107894682 A | 4/2018 |
| CN | 207488661 U | 6/2018 |

OTHER PUBLICATIONS

Xijie Chen, the International Searching Report, dated Jan. 2019, CN.

\* cited by examiner

Making a wiring area on a surface at one side of the substrate

Arranging multiple external connection wires and metal wires that are connected vertically in the wiring area Arranging conductive glass tracks correspondingly at side edges of the external connection wires and the metal wires when jumper wire positions of the metal wires and the external connection wires are electrostatically damaged, cutting off metal wire portions or external connection wire portions at side edges of electrostatically damaged positions of the metal wires and the external connection wires by a laser, and then performing laser welding on the metal wires or the external connection wires and the conductive glass tracks

FIG. 8

REPAIRING METAL WIRE(S) AND EXTERNAL CONNECTION WIRE(S) OF A DISPLAY PANEL DAMAGED BY STATIC ELECTRICITY BY USING CONDUCTIVE GLASS WIRE(S)

TECHNICAL FIELD

This application claims the priority of Chinese patent application No. CN 2017110713329, entitled "DISPLAY PANEL AND MANUFACTURING METHOD" and filed with the Patent Office of the People's Republic of China on Nov. 3, 2017, the entire content of which is incorporated herein by reference.

BACKGROUND

The statements in this section merely provide background information related to the present application and may not constitute prior art.

In a Thin Film Transistor-Liquid Crystal Display (TFT-LCD) panel manufacturing process, a glass substrate will rub against a machine table or the air to generate a static electricity during movement and transportation. When the static electricity is accumulated to a certain extent on the glass, a huge potential difference will be generated and thus accumulated charges have enough energies to leave away from original positions and neutralize with charges having a reverse polarity. The movement of the charges is completed within a very short time, and a very large current is generated in this process, like the formation of a lightning. A position where the destructiveness of such a discharge process is occurred is mastered difficultly. If it is occurred at a metal staggered place, the electrostatic breakdown is easily caused so that a metal is shorted out and a function is abnormal. This is a particular case for a place where big pieces of metals are staggered or a metal jumper wire place.

With electrostatic protection in a TFT-LCD production process, a production environment may be controlled on one hand, for example, an environmental humidity is controlled, an electron wind is used to blow in a transmission system, and a low substrate transmission speed is set and the like. On the other hand, some electrostatic protection designs may be added on the panel design, for example, a series impedance, a lightning rod type pattern design, a design of a bidirectional protection transistor and the like are added.

However, for some tracks outside a panel such as an array test track, a cell curing track and a cell test track, since many tracks are provided at a jumper wire position, the wiring is complex and the space is small, a bidirectional transistor cannot be designed to protect a circuit. In this case, the problem of an electrostatic damage is occurred easily to result in a short circuit of the metal or the short circuit and it is irreversible. In case of the short circuit, an adjacent signal is abnormal. As a result, the array test and the cell test will appear the problem and the product yield is reduced.

Therefore, providing a display panel and a display apparatus which may guarantee the normal tracking function, reduce the scraps and thus improve the plant yield has become a technical problem to be solved by those skilled in the art urgently.

SUMMARY

The present application relates to a display panel and a manufacturing method, which may guarantee the normal tracking function, reduce the scraps and thus improve the plant yield.

Its addition, the present application further relates to a display panel, which includes:
 a substrate;
 the substrate includes a display area inside and a wiring area outside; and
 the wiring area includes external connection wires; the external connection wires are coupled with metal wires; conductive glass tracks are correspondingly arranged at side edges of the external connection wires and the metal wires; and the conductive glass tracks are configured to repairing electrostatically damaged positions of the metal wires and the external connection wires.

Optionally, the external connection wires include a first external connection wire, a second external connection wire and a third external connection wire parallel to each other; the metal wires include a first metal wire, a second metal wire and a third metal wire; the first external connection wire is electrically connected with the first metal wire; the second external connection wire is electrically connected with the second metal wire; the third external connection wire is electrically connected with the third metal wire; the conductive glass tracks include a first conductive glass track and a second conductive glass track; one end of the first conductive glass track is electrically connected with the first external connection wire, and the other end of the first conductive glass track is overlapped with the first metal wire; and one end of the second conductive glass track is electrically connected with the second external connection wire and the other end of the second conductive glass track is overlapped with the second metal wire.

Optionally, the first external connection wire is vertically coupled with the first metal wire; one end of the first conductive glass track is electrically connected with the first external connection wire, and the other end of the first conductive glass track is far away from the first metal wire; the second external connection wire is vertically coupled with the second metal wire; and one end of the second conductive glass track is electrically connected with the second external connection wire, and the other end of the second conductive glass track is far away from the second metal wire.

Optionally, one end of the first conductive glass track is electrically connected with the first external connection wire, and the other end of the first conductive glass track is electrically connected with the first metal wire; jumper wire overlapped portions of the first metal wire with the external connection wires are cut off; one end of the second conductive glass track is electrically connected with the second external connection wire, and the other end of the second conductive glass track is electrically connected with the second metal wire; and jumper wire overlapped portions of the second metal wire with the external connection wires are cut off.

Optionally, the external connection wires include a first external connection wire, a second external connection wire and a third external connection wire parallel to each other; the metal wires include a first metal wire, a second metal wire and a third metal wire; the first external connection wire is electrically connected with the first metal wire; the second external connection wire is electrically connected with the second metal wire; the third external connection wire is electrically connected with the third metal wire; the conductive glass tracks include a third conductive glass track, a fourth conductive glass track and a fifth conductive glass track; the third conductive glass track is arranged at a side edge of a jumper wire position of the second external connection wire and the first metal wire; the fourth conductive glass track is arranged at a side edge of a jumper wire position of the third external connection wire and the first metal wire; and the fifth conductive glass track is arranged at a side edge of a jumper wire position of the third external connection wire and the second metal wire.

Optionally, the third conductive glass track is arranged at two sides of a juniper wire crossed point of the second external connection wire and the first metal wire in an overlapped rainier; the fourth conductive glass track is arranged at two sides of a jumper wire crossed point of the third external connection wire and the first metal wire in an overlapped mailer; and the fifth conductive glass track is arranged at two sides of juniper wire crossed point of the third external connection wire and the second metal wire in an overlapped manner.

Optionally, two edges of the jumper wire crossed point of the second external connection wire and the first metal wire are disconnected; and the third conductive glass track is connected from one side of the jumper wire crossed point of the second external connection Wire and the first Metal wire to the other side.

Optionally, two edges of the juniper wire crossed point of the third external connection wire and the first metal wire are disconnected; and the fourth conductive glass track is connected from one side of the juniper wire crossed point of the third external connection wire and the first metal wire to the other side.

The present application further relates to a display panel, which includes:
 a substrate;
 the substrate includes a display area inside and a wiring area outside;
 the wiring area includes external connection wires; the external connection wires are coupled with metal wires; conductive glass tracks are correspondingly arranged at side edges of the external connection wires and the metal wires; the conductive glass tracks are configured to repairing electrostatically damaged positions of the metal wires and the external connection wires;
 the external connection wires include a first external connection wire, a second external connection wire and a third external connection wire parallel to each other; the metal wires include a first metal wire, a second metal wire and a third metal wire; the first external connection wire is electrically connected with the first metal wire; the second external connection wire is electrically connected with the second metal wire; the third external connection wire is electrically connected with the third metal wire; the conductive glass tracks include a first conductive glass track and a second conductive glass track; one end of the first conductive glass track is electrically connected with the first external connection wire, and the other end of the first conductive glass track is overlapped with the first metal wire; one end of the second conductive glass track is electrically connected with the second external connection wire and the other end of the second conductive glass track is overlapped with the second metal wire; and
 the first external connection wire is coupled with the first metal wire; one end of the first conductive glass track is electrically connected with the first external connection wire, and the other end of the first conductive glass track is far away from the first metal wire; the second external connection wire is coupled with the second metal wire; and one end of the second conductive glass track is electrically connected with the second external connection wire, and the other end of the second conductive glass track is far away from the second metal wire.

The present application further relates to a display panel manufacturing method, which includes:
 making a wiring area on a surface at one side of the substrate;
 arranging multiple external connection wires and metal wires that are connected vertically in the wiring area;
 arranging conductive glass tracks correspondingly at side edges of the external connection wires and the metal wires; and
 when juniper wire positions of the metal wires and the external connection wires are electrostatically damaged, cutting off metal wire portions or external connection wire portions at side edges of electrostatically damaged positions of the metal wires and the external connection wires by a laser, and then performing laser welding on the metal wires or the external connection wires and the conductive glass tracks.

Optionally, the step of arranging multiple external connection wires and metal wires that are connected in the wiring area includes: distributing the external connection wires into a first external connection wire, a second external connection wire and a third external connection wire in parallel, and distributing the metal wires into a first metal wire, a second metal wire and a third metal wire, wherein the first external connection wire is electrically connected with the first metal wire, the second external connection wire is electrically connected with the second metal wire and the third external connection wire is electrically connected with the third metal wire; and dividing the conductive glass tracks into a first conductive glass track and a second conductive glass track, wherein one end of the first conductive glass track is electrically connected with the first external connection wire, and the other end of the first conductive glass track is overlapped with the first metal wire; and one end of the second conductive glass track is electrically connected with the second external connection wire and the other end of the second conductive glass track is overlapped with the second metal wire.

Optionally, when the metal wires and the external connection wires are not electrostatically damaged, the first conductive glass track is far away from the first metal wire, and the second conductive glass track is far away from the second metal wire.

Optionally, when a position where the first metal wire and the second external connection wire are staggered is electrostatically damaged, jumper wire overlapped portions of the first metal wire with the external connection wires are cut off, and one end of the first conductive glass track is electrically connected with the first external connection wire, and the other end of the first conductive glass track is electrically connected with the first metal wire.

Optionally, when a position where the second metal wire and the third external connection wire are staggered is electrostatically damaged, jumper wire overlapped portions of the second metal wire with the external connection wires are cut off, and one end of the second conductive glass track is electrically connected with the second external connection wire, and the other end of the second conductive glass track is electrically connected with the second metal wire.

Optionally, the step of arranging multiple external connection wires and metal wires that are vertically connected in the wiring area includes:
 dividing the conductive glass tracks into a third conductive glass track, a fourth conductive glass track and a fifth conductive glass track, wherein the third conductive glass track is arranged at a side edge of a jumper wire position of the second external connection wire and the first metal wire, the fourth conductive glass track is arranged at a side edge of a jumper wire position of the third external connection wire and the first metal wire, and the fifth conductive glass track is arranged at a side edge of a jumper wire position of the third external connection wire and the second metal wire.

Optionally, when positions where the metal wires and the external connection wires are staggered are not electrostatically damaged, the third conductive glass track, the fourth conductive glass track and the fifth conductive glass track are far away from the external connection wires and the metal wires.

Optionally, when a jumper wire staggered position of the second external connection wire and the first metal wire is electrostatically damaged, the external connection wires at two sides of the damaged place are cut off first, and then the third conductive glass track is connected to the external connection wires at the two sides of the damaged place.

Optionally, when a jumper wire staggered position of the third external connection wire and the first metal wire is electrostatically damaged, the external connection wires at two sides of the damaged place are cut off first, and then the fourth conductive glass track is connected to the external connection wires at the two sides of the damaged place.

Optionally, when a jumper wire staggered position of the third external connection wire and the second metal wire is electrostatically damaged, the external connection wires at two sides of the damaged place are cut off first, and then the fifth conductive glass track is connected to the external connection wires at the two sides of the damaged place.

In the present application, the conductive glass tracks are arranged in the outside wiring area of the substrate and at side edge positions of the external connection wires and the metal wires, so when the external connection wires and the metal wires are electrostatically damaged and are shorted out, the metal wire portions or the external connection wire portions at side edges of electrostatically damaged positions of the metal wires and the external connection wires are cut off by the laser first via the reserved conductive glass tracks and then the laser welding is performed on the metal wires or the external connection wires and the conductive glass tracks. In this way, when the metal wires and the external connection wires are electrostatically damaged, by repairing in time, the tracking function is guaranteed to be normal, the scraps are reduced and thus the plant yield is improved.

BRIEF DESCRIPTION OF DRAWINGS

The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts. In the accompanying drawings:

FIG. 8 is a flowchart schematic diagram of a display panel manufacturing method according to an embodiment of the present application.

DETAILED DESCRIPTION

Figure 1:
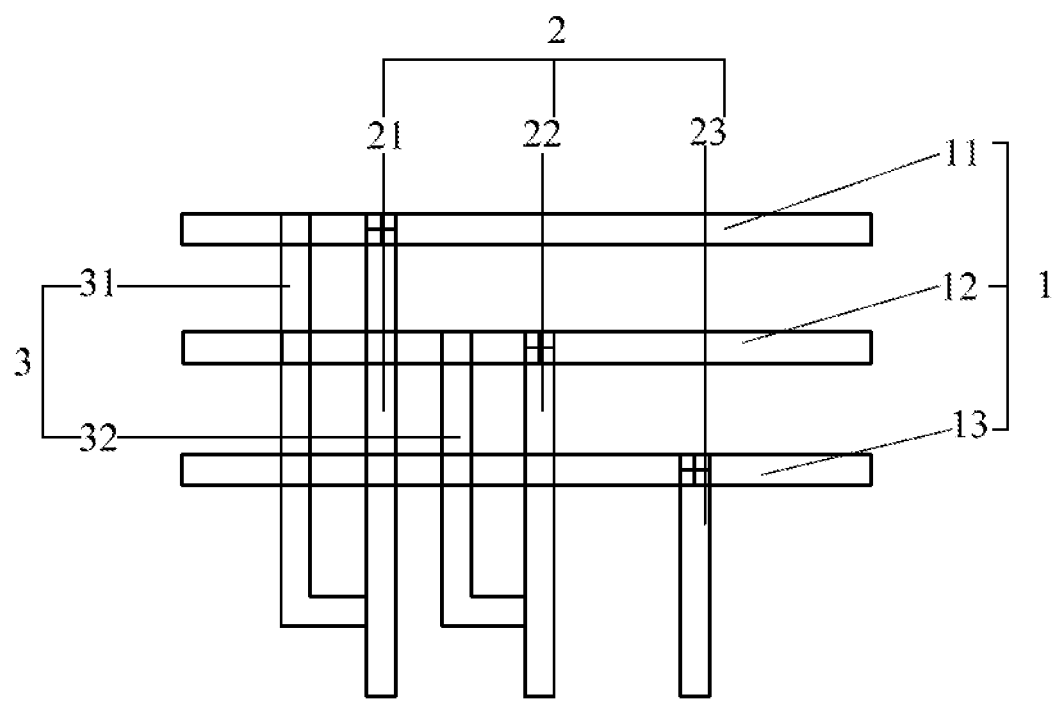
FIG. 1 is a structural schematic diagram of a tracking structure of a display panel according to an embodiment of the present application.

Details on structures and functions of the present application are merely representative and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms "first", "second" are merely for a descriptive purpose, and cannot to be understood to indicate or imply a relative, importance, or implicitly indicate the number of the indicated technical features. Hence, the features defined by "first", "second" can explicitly or implicitly include one or more of the features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or coupled; or directly connected or indirectly connected through an intermediate medium, or in an internal communication between two elements. The specific meanings about the foregoing terms in the present application may be understood for those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

Figure 2:
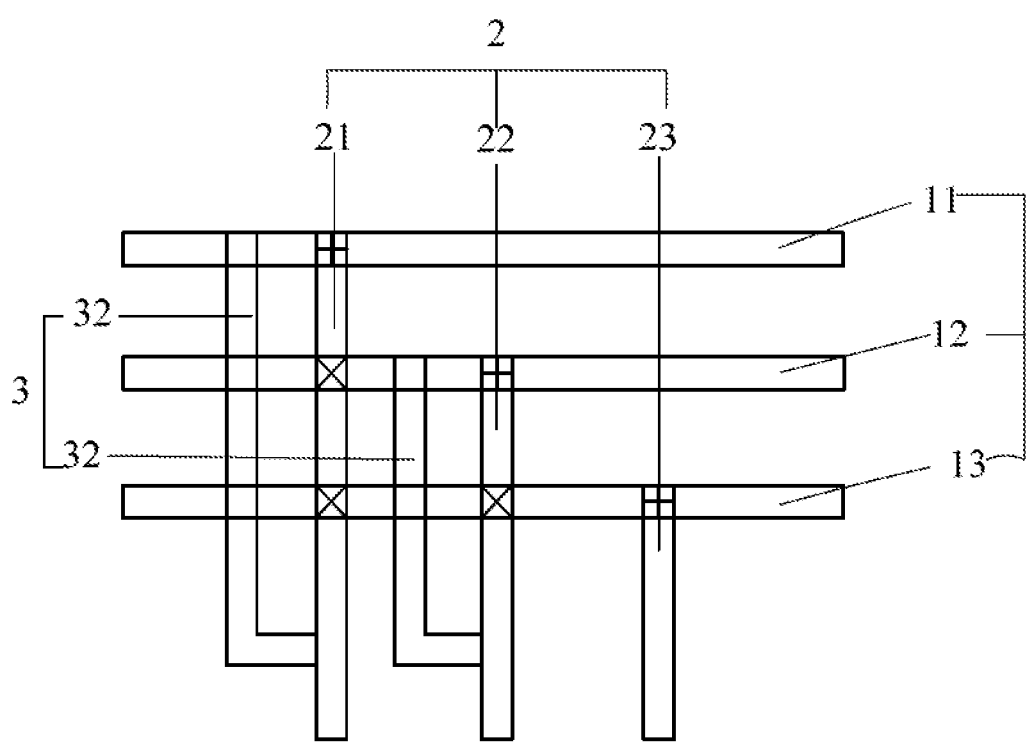
FIG. 2 is a structural schematic diagram after a display panel is electrostatically damaged according to an embodiment of the present application.
Figure 3:
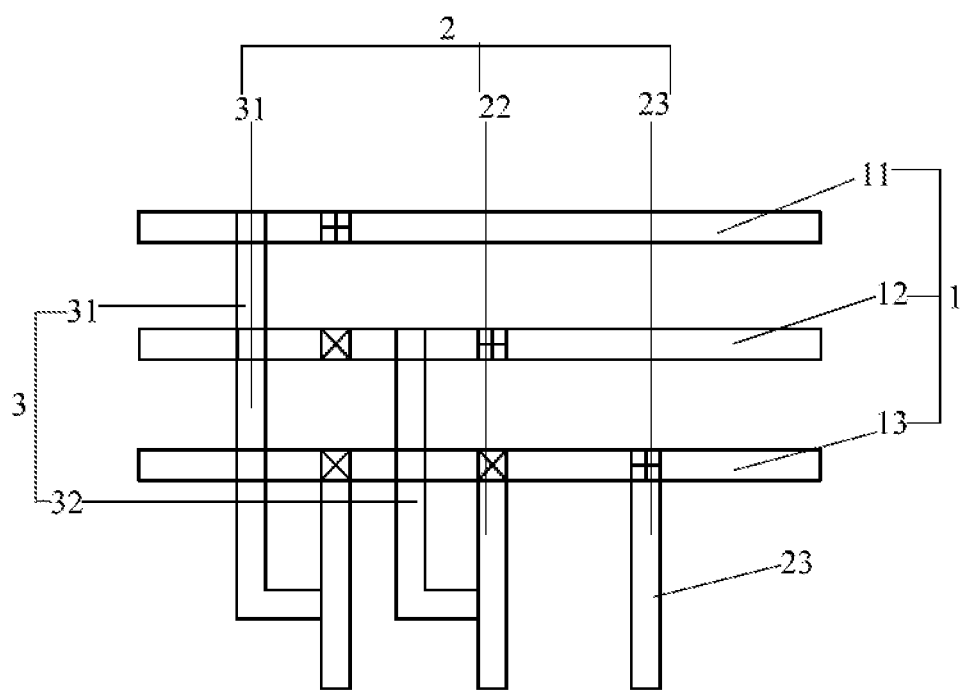
FIG. 3 is a structural schematic diagram for repair after a track structure of a display panel is electrostatically damaged according to an embodiment of the present application.
Figure 4:
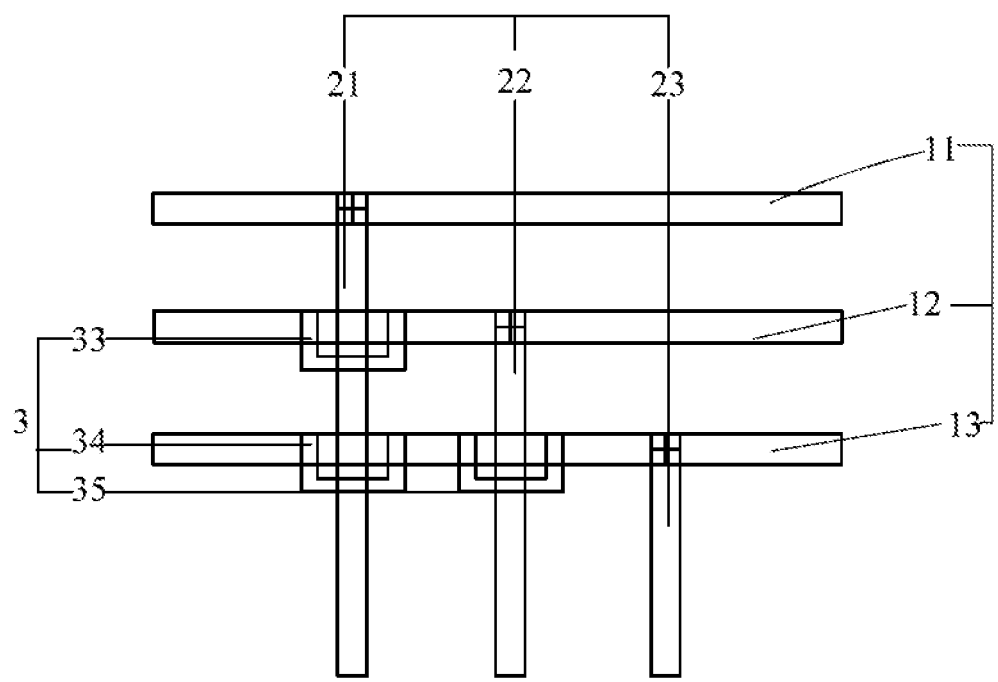
FIG. 4 is a structural schematic diagram of a track structure of a display panel according to an embodiment of the present application.
Figure 5:
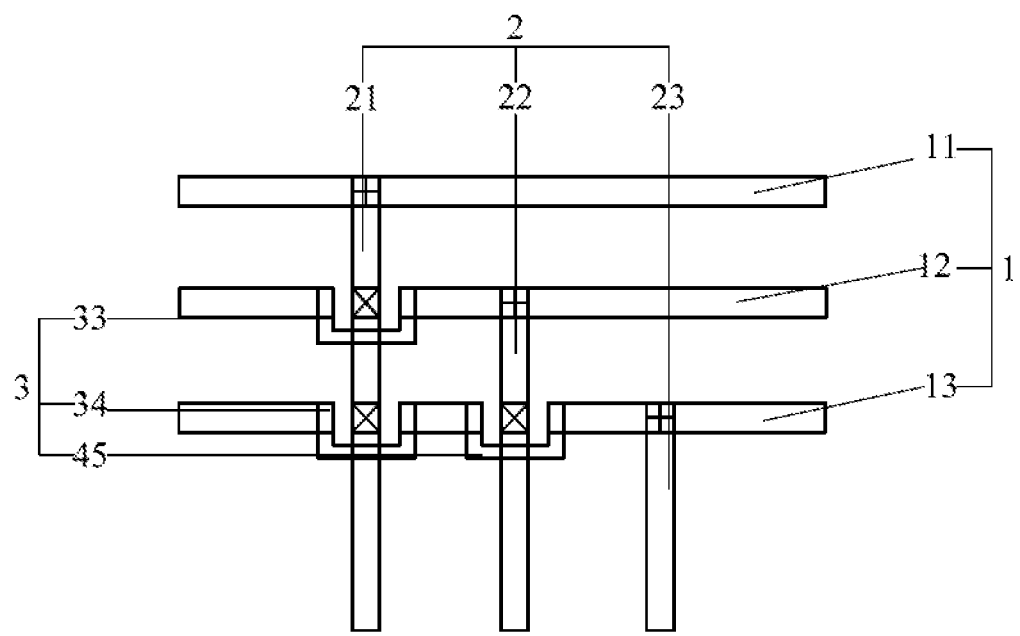
FIG. 5 is a structural schematic diagram after a track structure of a display panel is electrostatically damaged according to an embodiment of the present application.
Figure 6:
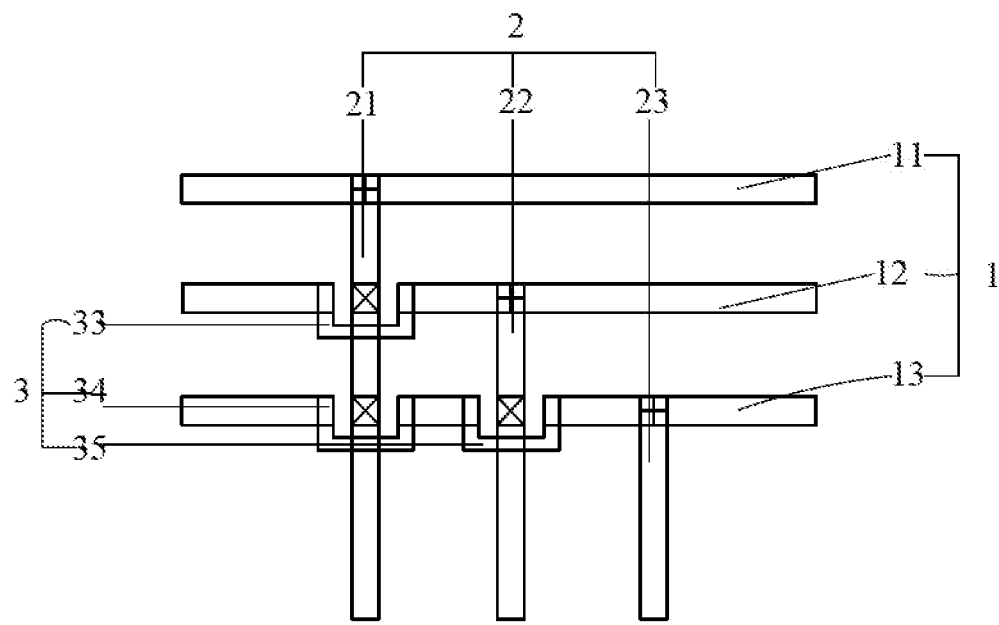
FIG. 6 is a structural schematic diagram for repair after a track structure of a display panel is electrostatically damaged according to an embodiment of the present application.
Figure 7:
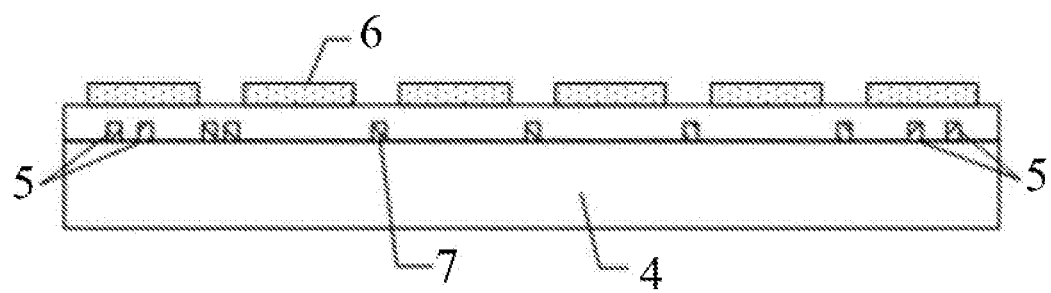
FIG. 7 is a structural schematic diagram of a display panel according to an embodiment of the present application.

As shown in FIG. 1 to FIG. 7, an embodiment discloses a display panel, which includes: a substrate 4; the substrate 4 includes a display area 6 inside and a wiring area 5 outside; the wiring area 5 includes external connection wires 1; the external connection wires 1 are coupled with metal wires 2; conductive glass tracks 3 are correspondingly arranged at side edges of the external connection wires 1; and the metal wires 2; and the conductive glass tracks 3 are configured to repairing electrostatically damaged positions of the metal wires and the external connection wires. Wherein, the display panel further includes an active switch, a data line 7 and a scanning line; and the data line 7 and the scanning line are connected with the active switch.

In the present application, the conductive glass tracks are arranged in the outside wiring area 5 of the substrate 1 and at side edge positions of the external connection wires and the metal wires 2, so when the external connection wires 1 and the metal wires 2 are electrostatically damaged and are shorted out, the metal wire portions or the external connection wire portions at side edges of electrostatically damaged positions of the metal wires 1 and the external connection wires 1 are cut off by the laser first via the reserved conductive glass tracks 3 and then the laser welding is performed on the metal wires 2 or the external connection wires 1 and the conductive glass tracks 3. In this way, when the metal wires 2 and the external connection wires 1 are electrostatically damaged, by repairing in time, the tracking function is guaranteed to be normal, the scraps are reduced and thus the plant yield is improved.

As a further improvement of this embodiment, wherein, the external connection wires 1 include a first external connection wire 11, a second external connection wire 12 and a third external connection wire 13 parallel to each other; the metal wires 2 include a first metal wire 21, a second metal wire 22 and a third metal wire 23; the first external connection wire 11 is electrically connected with the first metal wire 21; the second external connection wire 12 is electrically connected with the second metal wire 22; the third external connection wire 13 is electrically connected with the third metal wire 23; the conductive glass tracks 3 include a first conductive glass track 31 and a second conductive glass track 32; one end of the first conductive glass track 31 is electrically connected with the first external connection wire 11, and the other end of the first conductive glass track 31 is overlapped with the first metal wire 21; and one end of the second conductive glass track 32 is electrically connected with the second external connection wire 12 and the other end of the second conductive glass track 32 is overlapped with the second metal wire 22.

One end of the first conductive glass track 31 is electrically connected with the first external connection wire 11, and the other end of the first conductive glass track 31 is overlapped with the first metal wire 21, and one end of the second conductive glass track 32 is electrically connected with the second external connection wire 12 and the other end of the second conductive glass track 32 is overlapped with the second metal wire 22. In this way, when the metal wires and the external connection wires are not electrostatically damaged, the first conductive glass track 31 and the second conductive glass track 32 are arranged at predetermined positions; and when jumper wire staggered positions of corresponding metal wires and the external connection wires are electrostatically damaged, positions that are electrostatically damaged may be repaired by only welding a position where the first conductive glass track 31 and the first metal wire 21 are overlapped, or welding a position where the second conductive glass track 32 and the second metal wire 22 are overlapped. Such a repair manner is quick and convenient, and thus the tracking function is guaranteed to be normal.

The first external connection wire 11 is an array test track, the second external connection wire 12 is a cell curing track and the external connection wire 13 is a cell test track. Of course, a position relation among the first external connection wire 11, the second external connection wire 12 and the third external connection wire 13 may be adjusted. In this embodiment, the first external connection wire 11, the second external connection wire 12 and the third external connection wire 13 are not specifically defined. Therefore, it cannot be considered that those obtained by only changing positions of the first external connection wire 11, the second external connection wire 12 and the third external connection wire 13 are substantively distinguished from the technical solutions of the present application.

As a further improvement of this embodiment, wherein, the first external connection wire 11 is vertically coupled with the first metal wire 21; one end of the first conductive glass track 31 is electrically connected with the first external connection wire 11, and the other end of the first conductive glass track 31 is far away from the first metal wire 21; the second external connection wire 12 is vertically coupled with the second metal wire 22; and one end of the second conductive glass track 32 is electrically connected with the second external connection wire 12, and the other end of the second conductive glass track 32 is far away from the second metal wire 22. In this embodiment, the specific scene is as follows: When the metal wires and the external connection wires are not electrostatically damaged, the first conductive glass track 31 is not electrically connected with the first metal wire 21, the second conductive glass track 32 is not electrically connected with the second metal wire 22, and the metal wires and the external connection wires are normally connected. At this moment, the tracking function is normal. In this way, when there is no electrostatic damage, the normal tracking function is not affected by the first conductive glass track 31 and the second conductive glass track 32.

As a further improvement of this embodiment, wherein, one end of the first conductive glass track 31 is electrically connected with the first external connection wire 11, and the other end of the first conductive glass track 31 is electrically connected with the first metal wire 21; jumper wire overlapped portions of the first metal wire 21 with the external connection wires are cut off; one end of the second conductive glass track 32 is electrically connected with the second external connection wire 12, and the other end of the second conductive glass track 32 is electrically connected with the second metal wire 22; and jumper wire overlapped portions of the second metal wire 22 with the external connection wires are cut off. In this embodiment, the specific scene is as follows: when a position where the first metal wire 21 and the second external connection wire 12 are staggered is electrostatically damaged, the jumper wire overlapped portions of the first metal wire 21 with the external connection wires are cut off, one end of the first conductive glass track 31 is electrically connected with the first external connection wire 11 and the other end of the first conductive glass track 31 is electrically connected with the first metal wire 21, and thus the normal operations of the first metal wire 21 and the first external connection wire 11 are guaranteed. When a position where the second metal wire 22 and the third external connection wire 13 are staggered is electrostatically damaged, the juniper wire overlapped portions of the second metal wire 22 with the external connection wires are cut off, one end of the second conductive glass track 32 is electrically connected with the second external connection wire 12 and the other end of the second conductive glass track 32 is electrically connected with the second metal wire 22, and thus the normal operations of the second metal wire 22 and the second external connection wire 12 are guaranteed.

As a further improvement of this embodiment, wherein, the external connection wires include a first external connection wire 11, a second external connection wire 12 and a third external connection wire 13 parallel to each other; the metal wires include a first metal wire 21, a second metal wire 22 and a third metal wire 23; the first external connection wire 11 is electrically connected with the first metal wire 21; the second external connection wire 12 is electrically connected with the second metal wire 221 the third external connection wire 13 is electrically connected with the third metal wire 23; the conductive glass tracks 3 include a third conductive glass track 33, a fourth conductive glass track 34 and a fifth conductive glass track 35; the third conductive glass track 33 is arranged at a side edge of a jumper wire position of the second external connection wire 12 and the first metal wire 21; the fourth conductive glass track 34 is arranged at a side edge of a jumper wire position of the third external connection wire 13 and the first metal wire 21; and the fifth conductive glass track 35 is arranged at a side edge of a jumper wire position of the third external connection wire 13 and the second metal wire 22. As the third conductive glass track 33 is arranged at the side edge of the jumper wire position of the second external connection wire 12 and the first metal wire 21, the fourth conductive glass track 34 is arranged at the side edge of the jumper wire position of the third external connection wire 13 and the first metal wire 21, and the fifth conductive glass track 35 is arranged at the side edge of the jumper wire position of the third external connection wire 13 and the second metal wire 22, through the arrangement of the three conductive glass tracks, when juniper wire staggered positions of corresponding metal wires and the external connection wires are electrostatically damaged, the electrostatically damaged positions may be repaired in time via the reserved three conductive glass tracks, and thus the tracking function may be guaranteed to operate normally.

As a further improvement of this embodiment, wherein, the third conductive glass track is arranged at two sides of a jumper wire crossed point of the second external connection wire 12 and the first metal wire 21 in an overlapped manner; the fourth conductive glass track is arranged at two sides of a jumper wire crossed point of the third external connection wire 13 and the first metal wire 21 in an overlapped manner; and the fifth conductive glass track is arranged at two sides of a jumper wire crossed point of the third external connection wire 13 and the second metal wire 22 in an overlapped manner. When the metal wires and the external connection wires are not electrostatically damaged, the third conductive glass track 33, the fourth conductive glass track 34 and the fifth conductive glass track 35 are not connected with the external connection wires and the metal wires, and the normal tracking function is not affected by the third conductive glass track 33, the fourth conductive glass track 34 and the fifth conductive glass track 35.

As a further improvement of this embodiment, wherein, two edges of the jumper wire crossed point of the second external connection wire 12 and the first metal wire 21 are disconnected; and the third conductive glass track 33 is connected from one side of the juniper wire crossed point of the second external connection wire 12 and the first metal wire 21 to the other side. When a jumper wire staggered position of the first external connection wire 12 and the first metal wire 21 is electrostatically damaged, external connection wires at two sides of the damaged place are cut off first and then the third conductive glass track 33 is connected to the external connection wires at the two sides of the damaged place. In this way, the electrostatically damaged place may be repaired and the normal operation of the tracking function is guaranteed.

As a further improvement of this embodiment, wherein, two edges of the jumper wire crossed point of the third external connection wire 13 and the first metal wire 21 are disconnected; and the fourth conductive glass track 34 is connected from one side of the jumper wire crossed point of the third external connection wire 13 and the first metal wire 21 to the other side. When a jumper wire staggered position of the third external connection wire 13 and the first metal wire 21 is electrostatically damaged, external connection wires at two sides of the damaged place are cut off first and then the fourth conductive glass track 34 is connected to the external connection wires at the two sides of the damaged place. In this way, the electrostatically damaged place may be repaired and the normal operation of the tracking function is guaranteed.

As a further improvement of this embodiment, wherein, two edges of the jumper wire crossed point of the third external connection wire 13 and the second metal wire 22 are disconnected; and the fifth conductive glass track 35 is connected from one side of the jumper wire crossed point of the third external connection wire 13 and the second metal wire 22 to the other side. When a jumper wire staggered position of the third external connection wire 13 and the second metal wire 22 is electrostatically damaged, external connection wires at two sides of the damaged place are cut off first and then the fifth conductive glass track 35 is connected to the external connection wires at the two sides of the damaged place. In this way, the electrostatically damaged place may be repaired and the normal operation of the tracking function is guaranteed.

According to another embodiment of the present application, the present application relates to a display panel, which includes: a substrate; the substrate includes a display area inside and a wiring area outside; the wiring area includes external connection wires 1; the external connection wires 1 are coupled with metal wires 2; conductive glass tracks 3 are correspondingly arranged at side edges of the external connection wires 1 and the metal wires 2; and the conductive glass tracks 3 are configured to repairing electrostatically damaged positions of the metal wires and the external connection wires. The external connection wires 1 include a first external connection wire 11, a second external connection wire 12 and a third external connection wire 13 parallel to each other; the metal wires 2 include a first metal wire 21, a second metal wire 22 and a third metal wire 23; the first external connection wire 11 is electrically connected with the first metal wire 21; the second external connection wire 12 is electrically connected with the second metal wire 22; the third external connection wire 13 is electrically connected With the third metal wire 23; the conductive glass tracks 3 include a first conductive glass track 31 and a second conductive glass track 32; one end of the first conductive glass track 31 is electrically connected with the first external connection wire 11, and the other end of the first conductive glass track 31 is overlapped with the first metal wire 21; and one end of the second conductive glass track 32 is electrically connected with the second external connection wire 12 and the other end of the second conductive glass track 32 is overlapped with the second metal wire 22. The first external connection wire 11 is vertically coupled with the first metal wire 21; one end of the first conductive glass track 31 is electrically connected with the first external connection wire 11, and the other end of the first conductive glass track 31 is far away from the first metal wire 21; the second external connection wire 12 is vertically coupled with the second metal wire 22; and one end of the second conductive glass track 32 is electrically connected with the second external connection wire 12, and the other end of the second conductive glass track 32 is far away from the second metal wire 22. In this embodiment, the specific scene is as follows: when the metal wires and the external connection wires are not electrostatically damaged, the first conductive glass track 31 is not electrically connected with the first metal wire 21, the second conductive glass track 32 is not electrically connected with the second metal wire 22, and the metal wires and the external connection wires are normally connected. At this moment, the tracking function is normal. In this way, when there is no electrostatic damage, the normal tracking function is not affected by the first conductive glass track 31 and the second conductive glass track 32.

One end of the first conductive glass track 31 is electrically connected with the first external connection wire 11, and the other end of the first conductive glass track 31 is overlapped with the first metal wire 21, and one end of the second conductive glass track 32 is electrically connected with the second external connection wire 12 and the other end of the second conductive glass track 32 is overlapped with the second metal wire 22. In this way, when the metal wires and the external connection wires are not electrostatically damaged, the first conductive glass track 31 and the second conductive glass track 32 are arranged at predetermined positions; and when jumper wire staggered positions of corresponding metal wires and the external connection wires are electrostatically damaged, positions that are electrostatically damaged may be repaired by only welding a position where the first conductive glass track 31 and the first metal wire 21 are overlapped, or welding a position where the second conductive glass track 32 and the second metal wire 22 are overlapped. Such a repair manner is quick and convenient, and thus the tracking function is guaranteed to be normal.

As shown in FIG. 8, the present application relates to a display panel manufacturing method, which includes:
  making a wiring area on a surface at one side of the substrate;
  arranging multiple external connection wires and metal wires that are connected in the wiring area;
  arranging conductive glass tracks correspondingly at side edges of the external connection wires and the metal wires; and
  when jumper wire positions of the metal wires and the external connection wires are electrostatically damaged, cutting off metal wire portions or external connection wire portions at side edges of electrostatically damaged positions of the metal wires and the external connection wires by a laser, and then performing laser welding on the metal wires or the external connection wires and the conductive glass tracks.

As a further improvement of this embodiment, wherein, the step of arranging multiple external connection wires and metal wires that are vertically connected in the wiring area includes:
  distributing the external connection wires into a first external connection wire 11, a second external connection wire 12 and a third external connection wire 13 in parallel, and distributing the metal wires into a first metal wire 21, a second metal wire 22 and a third metal wire 23, wherein the first external connection wire 11 is electrically connected with the first metal wire 21, the second external connection wire 12 is electrically connected with the second metal wire 22 and the third external connection wire 13 is electrically connected with the third metal wire 23; and dividing the conductive glass tracks into a first conductive glass track 31 and a second conductive glass track 32 that are L-shaped, wherein one end of the first conductive glass track 31 is electrically connected with the first external connection wire 11, and the other end of the first conductive glass track 31 is overlapped with the first metal wire 21, and one end of the second conductive glass track 32 is electrically connected with the second external connection wire 12 and the other end of the second conductive glass track 32 is overlapped with the second metal wire 22.

When the metal wires and the external connection wires are not electrostatically damaged, the first conductive glass track 31 is not electrically connected with the first metal wire 21, and the second conductive glass track 32 is not electrically connected with the second metal wire 22. In this way, when there is no electrostatic damage, the normal tracking function is not affected by the first conductive glass track 31 and the second conductive glass track 32.

When a position where the first metal wire 21 and the second external connection wire 12 are staggered is electrostatically damaged, jumper wire overlapped portions of the first metal wire 21 with the external connection wires are cut off, and one end of the first conductive glass track 31 is electrically connected with the first external connection wire 11 and the other end of the first conductive glass track 31 is electrically connected with the first metal wire 21, so that the normal operations of the first metal wire 21 and the first external connection wire 11 are guaranteed.

When a position where the second metal wire 22 and the third external connection wire 13 are staggered is electrostatically damaged, jumper wire overlapped portions of the second metal wire 22 with the external connection wires are cut off, and one end of the second conductive glass track 32 is electrically connected with the second external connection wire 12 and the other end of the second conductive glass track 32 is electrically connected with the second metal wire 22, so that the normal operations of the second metal wire 22 and the second external connection wire 12 are guaranteed.

As a further improvement of this embodiment, wherein, the step of arranging multiple external connection wires and metal wires that are vertically connected in the wiring area includes:
  dividing the conductive glass tracks into a third conductive glass track 33, a fourth conductive glass track 34 and a fifth conductive glass track 35 that are U-shaped, wherein the third conductive glass track 33 is arranged at a side edge of a jumper wire position of the second external connection wire 12 and the first metal wire 21, the fourth conductive glass track 34 is arranged at a side edge of a jumper wire position of the third external connection wire 13 and the first metal wire 21, and the fifth conductive glass track 35 is arranged at a side edge of a jumper wire position of the third external connection wire 13 and the second metal wire 22.

When positions where the metal wires and the external connection wires are staggered are not electrostatically damaged, the third conductive glass track 33, the fourth conductive glass track 34 and the fifth conductive glass track 35 are not connected with the external connection wires and the metal wires, and the normal tracking function is not affected by the third conductive glass track 33, the fourth conductive glass track 34 and the fifth conductive glass track 35.

When a jumper wire staggered position of the first external connection wire 12 and the first metal wire 21 is electrostatically damaged, external connection wires at two sides of the damaged place are cut off first and then the third conductive glass track 33 is connected to the external connection wires at the two sides of the damaged place. In this way, the electrostatically damaged place may be repaired and the normal operation of the tracking function is guaranteed. When a jumper wire staggered position of the third external connection wire 13 and the first metal wire 21 is electrostatically damaged, external connection wires at two sides of the damaged place are cut off first and then the fourth conductive glass track 34 is connected to the external connection wires at the two sides of the damaged place. In this way, the electrostatically damaged place may be repaired and the normal operation of the tracking function is guaranteed. When a jumper wire staggered position of the third external connection wire 13 and the second metal wire 22 is electrostatically damaged, external connection wires at two sides of the damaged place are cut off first and then the fifth conductive glass track 35 is connected to the external connection wires at the two sides of the damaged place. In this way, the electrostatically damaged place may be repaired and the normal operation of the tracking function is guaranteed.

In the above embodiments, the display panel includes a liquid crystal panel, an OLED (Organic Light-Emitting Diode) panel, a QLED (Quantum Dot Light Emitting Diodes) panel, a plasma panel, a planar zed panel and a curved panel, etc.

The above are further detailed descriptions of the present application in combination with optional implementation manners and should not be deemed as that the optional implementation of the present application is only limited to these descriptions. Those of ordinary skill in the aft to which the present application belongs may further make a plurality of simple deviations or replacements without departing from the concept of the present application and all should be considered as a scope of protection of the present application.

What is claimed is:

1. A display panel, comprising:
a substrate;
the substrate comprises an inner enclose display area and an outer wiring area;
the wiring area comprises an external connection wire; the external connection wires are coupled with metal wire; conductive glass tracks are correspondingly arranged at side edges of the external connection wires and the metal wires; the conductive glass tracks are configured to repairing electrostatically damaged positions of the metal wires and the external connection wires;

the external connection wires comprise a first external connection wire, a second external connection wire and a third external connection wire parallel to each other; the metal wires comprise a first metal wire, a second metal wire and a third metal wire; the first external connection wire is electrically connected with the first metal wire; the second external connection wire is electrically connected with the second metal wire; the third external connection wire is electrically connected with the third metal wire; the conductive glass tracks comprise a first conductive glass track and a second conductive glass track; one end of the first conductive glass track is electrically connected with the first external connection wire, and the other end of the first conductive glass track is overlapped with the first metal wire; one end of the second conductive glass track is electrically connected with the second external connection wire and the other end of the second conductive glass track is overlapped with the second metal wire; and the first external connection wire is coupled with the first metal wire; one end of the first conductive glass track is electrically connected with the first external connection wire, and the other end of the first conductive glass track is far away from the first metal wire; the second external connection wire is coupled with the second metal wire; and one end of the second conductive glass track is electrically connected with the second external connection wire, and the other end of the second conductive glass track is far away from the second metal wire.

2. A display panel, comprising:
a substrate;
the substrate comprises a display area inside and a wiring area outside; and
the wiring area comprises external connection wires; the external connection wires are coupled with metal wires; conductive glass tracks are correspondingly arranged at side edges of the external connection wires and the metal wires; and the conductive glass tracks are configured to repairing electrostatically damaged positions of the metal wires and the external connection wires.

3. The display panel according to claim 2, wherein the external connection wires comprise a first external connection wire, a second external connection wire and a third external connection wire parallel to each other; the metal wires comprise a first metal wire, a second metal wire and a third metal wire; the first external connection wire is electrically connected with the first metal wire; the second external connection wire is electrically connected with the second metal wire; the third external connection wire is electrically connected with the third metal wire; the conductive glass tracks comprise a first conductive glass track and a second conductive glass track; one end of the first conductive glass track is electrically connected with the first external connection wire, and the other end of the first conductive glass track is overlapped with the first metal wire; and one end of the second conductive glass track is electrically connected with the second external connection wire and the other end of the second conductive glass track is overlapped with the second metal wire.

4. The display panel according to claim 3, wherein the first external connection wire is coupled with the first metal wire; one end of the first conductive glass track is electrically connected with the first external connection wire, and the other end of the first conductive glass track is far away from the first metal wire; the second external connection wire is coupled with the second metal wire; and one end of the second conductive glass track is electrically connected with the second external connection wire, and the other end of the second conductive glass track is far away from the second metal wire.

5. The display panel according to claim 3, wherein one end of the first conductive glass track is electrically connected with the first external connection wire, and the other end of the first conductive glass track is electrically connected with the first metal wire; jumper wire overlapped portions of the first metal wire with the external connection wires are cut off; one end of the second conductive glass track is electrically connected with the second external connection wire, and the other end of the second conductive glass track is electrically connected with the second metal wire; and jumper wire overlapped portions of the second metal wire with the external connection wires are cut off.

6. The display panel according to claim 2, wherein the external connection wires comprise a first external connection wire, a second external connection wire and a third external connection wire parallel to each other; the metal wires comprise a first metal wire, a second metal wire and a third metal wire; the first external connection wire is electrically connected with the first metal wire; the second external connection wire is electrically connected With the second metal wire; the third external connection wire is electrically connected with the third metal wire; the conductive glass tracks comprise a third conductive glass track, a fourth conductive glass track and a fifth conductive glass track; the third conductive glass track is arranged at a side edge of a jumper wire position of the second external connection wire and the first metal wire; the fourth conductive glass track is arranged at a side edge of a jumper wire position of the third external connection wire and the first metal wire; and the fifth conductive glass track is arranged at a side edge of a jumper wire position of the third external connection wire and the second metal wire.

7. The display panel according to claim 6, wherein the third conductive glass track is arranged at two sides of a jumper wire crossed point of the second external connection wire and the first metal wire in an overlapped manner; the fourth conductive glass track is arranged at two sides of a jumper wire crossed point of the third external connection wire and the first metal wire in an overlapped manner; and the fifth conductive glass track is arranged at two sides of a jumper wire crossed point of the third external connection wire and the second metal wire in an overlapped manner.

8. The display panel according to claim 6, wherein two edges of the jumper wire crossed point of the second external connection wire and the first metal wire are disconnected; and the third conductive glass track is connected from one side of the jumper wire crossed point of the second external connection wire and the first metal wire to the other side.

9. The display panel according to claim 6, wherein two edges of the jumper wire crossed point of the third external connection wire and the first metal wire are disconnected; and the fourth conductive glass track is connected from one side of the jumper wire crossed point of the third external connection wire and the first metal wire to the other side.

10. A display panel manufacturing method, comprising:
making a wiring area on a surface at one side of the substrate;
arranging multiple external connection wires and metal wires that are connected to the wiring area;
arranging conductive glass tracks correspondingly at side edges of the external connection wires and the metal wires; and
when jumper wire positions of the metal wires and the external connection wires are electrostatically damaged, cutting off metal wire portions or external connection wire portions at side edges of electrostatically damaged positions of the metal wires and the external connection wires by a laser, and then performing laser welding on the metal wires or the external connection wires and the conductive glass tracks.

11. The panel manufacturing method according to claim 10, wherein the step of arranging multiple external connection wires and metal wires that are connected in the wiring area comprises: distributing the external connection wires into a first external connection wire, a second external connection wire and a third external connection wire in parallel, and distributing the metal wires into a first metal wire, a second metal wire and a third metal wire, wherein the first external connection wire is electrically connected with the first metal wire, the second external connection wire is electrically connected with the second metal wire and the third external connection wire is electrically connected with the third metal wire; and dividing the conductive glass tracks into a first conductive glass track and a second conductive glass track, wherein one end of the first conductive glass track is electrically connected with the first external connection wire, and the other end of the first conductive glass track is overlapped with the first metal wire, and one end of the second conductive glass track is electrically connected with the second external connection wire and the other end of the second conductive glass track is overlapped with the second metal wire.

12. The panel manufacturing method according to claim 11, wherein when the metal wires and the external connection wires are not electrostatically damaged, the first conductive glass track is far away from the first metal wire, and the second conductive glass track is far away from the second metal wire.

13. The panel manufacturing method according to claim 11, wherein when a position where the first metal wire and the second external connection wire are staggered is electrostatically damaged, jumper wire overlapped portions of the first metal wire with the external connection wires are cut off, and one end of the first conductive glass track is electrically connected with the first external connection wire, and the other end of the first conductive glass track is electrically connected with the first metal wire.

14. The panel manufacturing method according to claim 11, wherein when a position where the second metal wire and the third external connection wire are staggered is electrostatically damaged, jumper wire overlapped portions of the second metal wire with the external connection wires are cut off, and one end of the second conductive glass track is electrically connected with the second external connection wire, and the other end of the second conductive glass track is electrically connected with the second metal wire.

15. The panel manufacturing method according to claim 10, wherein the step of arranging multiple external connection wires and metal wires that are vertically connected in the wiring area comprises:
dividing the conductive glass tracks into a third conductive glass track, a fourth conductive glass track and a fifth conductive glass track, wherein the third conductive glass track is arranged at a side edge of a jumper wire position of the second external connection wire and the first metal wire, the fourth conductive glass track is arranged at a side edge of a jumper wire position of the third external connection wire and the first metal wire, and the fifth conductive glass track is arranged at a side edge of a jumper wire position of the third external connection wire and the second metal wire.

16. The panel manufacturing method according to claim 15, wherein when positions where the metal wires and the external connection wires are staggered are not electrostatically damaged, the third conductive glass track, the fourth conductive glass track and the fifth conductive glass track are far away from the external connection wires and the metal wires.

17. The panel manufacturing method according to claim 15, wherein when a jumper wire staggered position of the second external connection wire and the first metal wire is electrostatically damaged, external connection wires at two sides of the damaged place are cut off first, and then the third conductive glass track is connected to the external connection wires at the two sides of the damaged place.

18. The panel manufacturing method according to claim 15, wherein when a jumper wire staggered position of the third external connection wire and the first metal wire is electrostatically damaged, external connection wires at two sides of the damaged place are cut off first, and then the fourth conductive glass track is connected to the external connection wires at the two sides of the damaged place.

19. The panel manufacturing method according to claim 15, wherein when a jumper wire staggered position of the third external connection wire and the second metal wire is electrostatically damaged, external connection wires at two sides of the damaged place are cut off first, and then the fifth conductive glass track is connected to the external connection wires at the two sides of the damaged place.

* * * * *